(12) United States Patent
Shao et al.

(10) Patent No.: US 12,402,303 B2
(45) Date of Patent: Aug. 26, 2025

(54) SEMICONDUCTOR STRUCTURE HAVING A PLURALITY OF BIT LINES SPACED APART FROM EACH OTHER IN A FIRST DIRECTION AND EXTEND IN A SECOND DIRECTION

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 408 days.

(21) Appl. No.: 17/932,276

(22) Filed: Sep. 14, 2022

(65) Prior Publication Data

US 2023/0012447 A1    Jan. 12, 2023

Related U.S. Application Data

(63) Continuation of application No. PCT/CN2022/100923, filed on Jun. 23, 2022.

(30) Foreign Application Priority Data

Jun. 13, 2022    (CN) .......................... 202210664897.2

(51) Int. Cl.
*H10B 12/00*    (2023.01)
*H01L 21/768*    (2006.01)

(52) U.S. Cl.
CPC ...... *H10B 12/482* (2023.02); *H01L 21/76811* (2013.01); *H10B 12/038* (2023.02)

(58) Field of Classification Search
CPC ... H10B 12/482; H10B 12/485; H10B 12/488
(Continued)

(56) References Cited

U.S. PATENT DOCUMENTS

| 5,990,509 A | 11/1999 | Burns, Jr. |
| 2011/0073939 A1 | 3/2011 | Mikasa |

(Continued)

FOREIGN PATENT DOCUMENTS

| CN | 102054820 A | 5/2011 |
| CN | 102522407 A | 6/2012 |

(Continued)

OTHER PUBLICATIONS

Supplementary European Search Report in the European application No. 22782656.7, mailed on Dec. 11, 2023. 7 pages.

(Continued)

*Primary Examiner* — Hoai V Pham
(74) *Attorney, Agent, or Firm* — Syncoda LLC; Feng Ma

(57) ABSTRACT

A semiconductor structure includes: a substrate; a plurality of active layers arranged on the substrate and spaced apart from each other; and a plurality of bit lines, spaced apart from each other in a first direction and extending in a second direction. A first portion of each bit line covers side surfaces of respective active layers of the plurality of active layers, and a second portion of each bit line is located in the respective active layers. The first direction and the second direction are parallel to a surface of the substrate, and the first direction intersects with the second direction.

16 Claims, 17 Drawing Sheets

(58) Field of Classification Search
USPC .................................................. 257/906, 907
See application file for complete search history.

(56) References Cited

U.S. PATENT DOCUMENTS

| | | |
|---|---|---|
| 2011/0101447 A1 | 5/2011 | Cho |
| 2011/0220977 A1 | 9/2011 | Yoon |
| 2013/0146958 A1 | 6/2013 | Kim |
| 2013/0161730 A1 | 6/2013 | Pan |
| 2013/0161832 A1 | 6/2013 | Cho |
| 2013/0320542 A1 | 12/2013 | Chang |
| 2014/0232014 A1 | 8/2014 | Cho et al. |
| 2016/0284710 A1 | 9/2016 | Kim et al. |
| 2018/0053770 A1 | 2/2018 | Kim et al. |
| 2021/0366911 A1 | 11/2021 | Yen |
| 2022/0157822 A1* | 5/2022 | Ahn .................... H10B 12/315 |

FOREIGN PATENT DOCUMENTS

| | | |
|---|---|---|
| CN | 103165539 A | 6/2013 |
| CN | 114121818 A | 3/2022 |
| JP | H10229175 A | 8/1998 |

OTHER PUBLICATIONS

JP first office action in application No. 2022-554946, mailed on Jul. 30, 2024.

* cited by examiner

SEMICONDUCTOR STRUCTURE HAVING A PLURALITY OF BIT LINES SPACED APART FROM EACH OTHER IN A FIRST DIRECTION AND EXTEND IN A SECOND DIRECTION

CROSS-REFERENCE TO RELATED APPLICATIONS

This application is a continuation application of International Patent Application No. PCT/CN2022/100923 filed on Jun. 23, 2022, which claims priority to Chinese Patent Application No. 202210664897.2 filed on Jun. 13, 2022. The disclosures of the above-referenced applications are hereby incorporated by reference in their entirety.

BACKGROUND

A memory is a memory component configured to store programs and various data information. In general, a Random Access Memory (RAM) used in a computer system may be classified into a Dynamic Random Access Memory (DRAM) and a Static Random-Access Memory (SRAM). The DRAM is a common semiconductor memory device in a computer, and is composed of a plurality of repeated memory cells.

The memory cell generally includes a capacitor and a transistor. A drain of the transistor is connected to a bit line, and a source of the transistor is connected to the capacitor. The capacitor includes a capacitance contact structure and capacitance. A word line of the memory cell is configured to control the turning on and turning off of a channel area of the transistor, so that data information stored in the capacitor is read by means of the bit line or is written into the capacitor for storage by means of the bit line.

However, there is a problem that it is difficult to form a consecutive bit line currently.

SUMMARY

Embodiments of the disclosure relate to the technical field of semiconductors, and in particular, to a semiconductor structure and a method for manufacturing a semiconductor structure.

Embodiments of the disclosure provide a semiconductor structure and a method for manufacturing a semiconductor structure, to at least reduce the difficulty of forming a consecutive bit line.

According to some embodiments of the disclosure, an aspect of an embodiment of the disclosure provides a semiconductor structure. The semiconductor structure includes: a substrate; a plurality of active layers, in which the plurality of active layers are arranged on the substrate and spaced apart from each other; and a plurality of bit lines, in which the plurality of bit lines are spaced apart from each other in a first direction and extend in a second direction, in which a first portion of each of the plurality of bit lines covers side surfaces of respective active layers of the plurality of active layers, and a second portion of each of the plurality of bit lines is located in the respective active layers; and in which the first direction and the second direction are parallel to a surface of the substrate, and the first direction intersects with the second direction.

According to some embodiments of the disclosure, another aspect of an embodiment of the disclosure provides a method for manufacturing a semiconductor structure, including the following operations. A base is provided, and a plurality of active layers spaced apart from each other in a first direction are formed in the base. A plurality of bit lines spaced apart from each other in the first direction are formed. The plurality of bit lines extend in a second direction. A first portion of each of the plurality of bit lines covers side surfaces of respective active layers of the plurality of active layers, and a second portion of each of the plurality of bit lines is located in the respective active layers. The first direction and the second direction are parallel to a surface of the base, and the first direction intersects with the second direction.

BRIEF DESCRIPTION OF THE DRAWINGS

One or more embodiments are exemplified by the figures in the corresponding drawings, and these exemplary descriptions do not constitute limitations of the embodiments. Unless otherwise stated, the figures in the drawings do not constitute a scale limitation. In order to more clearly illustrate the technical solutions in the embodiments of the disclosure or conventional technologies, the drawings used in the technical description of the embodiments will be briefly described below. It is apparent that the drawings in the following descriptions are merely some embodiments of the disclosure. Other drawings can be obtained from those skilled in the art according to these drawings without any creative work.

DETAILED DESCRIPTION

An embodiment of the disclosure provides a semiconductor structure. By disposing a first portion of a bit line on side surfaces of active layers and disposing a second portion of the bit line in the active layers, the bit line forms a consecutive line in a second direction. Through the connection between the first portion and the second portion, the reliability of the semiconductor structure can be improved, and a transmission function of the bit line can be guaranteed.

Embodiments of the disclosure are described in detail below with reference to the drawings. However, it is to be understood by those skilled in the art that in the embodiments of the disclosure, many technical details are provided for readers to better understand the disclosure. However, even without these technical details and various changes and modifications based on the following embodiments, the technical solutions claimed in the disclosure may also be realized.

Figure 1:
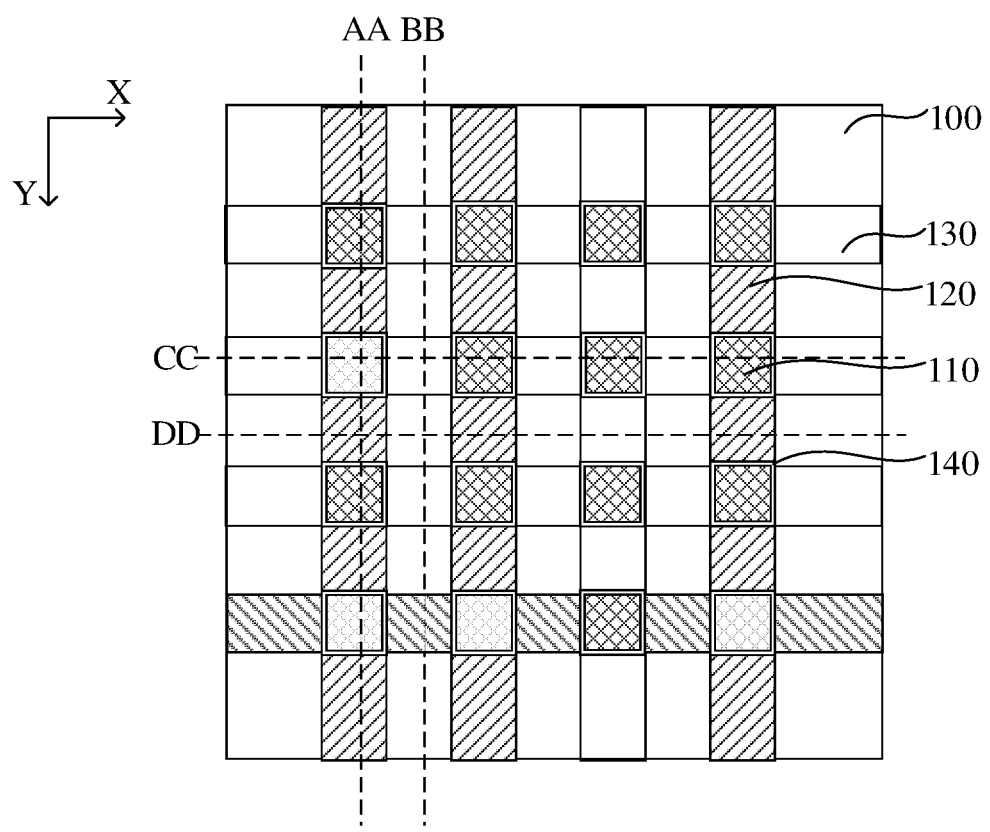
FIG. 1 is a top view of a semiconductor structure according to an embodiment of the disclosure.
Figure 2:
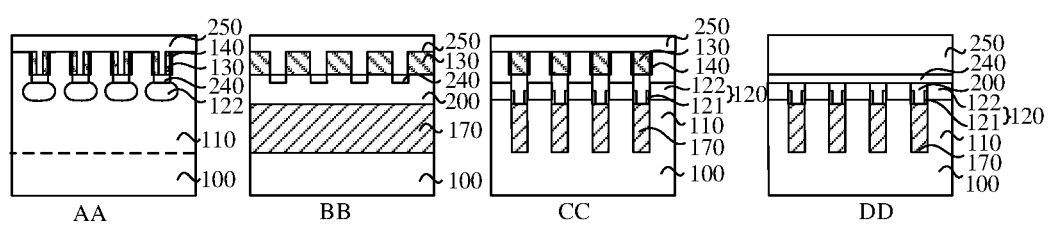
FIG. 2 is a cross-sectional view of a semiconductor structure according to an embodiment of the disclosure.

With reference to FIG. 1 and FIG. 2, FIG. 1 is a top view of a semiconductor structure according to an embodiment of the disclosure, and FIG. 2 is a cross-sectional view taken along a dotted line direction in FIG. 1 according to an embodiment of the disclosure.

With reference to FIG. 1, the semiconductor structure includes: a substrate 100; a plurality of active layers 110, in which the plurality of active layers 110 are arranged on the substrate 100 and spaced apart from each other; a plurality of bit lines 120, in which the plurality of bit lines 120 are spaced apart from each other in a first direction X and extend in a second direction Y; a plurality of word lines 130, in which the plurality of word lines 130 extend in the first direction X and are spaced apart from each other in the second direction Y; and a plurality of dielectric layers 140, in which each of the plurality of dielectric layers 140 is located on a sidewall of a respective one of the plurality of active layers 110, and the plurality of dielectric layers 140 are configured to prevent the plurality of word lines 130 from being in direct contact with the plurality of active layers 110. The first direction X and the second direction Y are parallel to a surface of the substrate 100, and the first direction X intersects with the second direction Y.

In some embodiments, a material of the substrate 100 may be a material such as silicon, germanium and silicon germanium, and the material of the substrate 100 may also be doped. By using the material of the substrate 100 being silicon as an example, if trace trivalent elements, such as boron, indium, gallium, and aluminum, are doped in the substrate 100, a P-type base may be formed. Likewise, if trace pentavalent elements, such as phosphorus, antimony, and arsenic, are doped in the substrate 100, an N-type base may be formed. The selection of doping elements for the substrate 100 may be considered according to actual requirements and aspects such as product performance. The material and doping elements of the substrate 100 are not limited in the disclosure.

In some embodiments, the word line 130 may be a multi-layer stack structure, for example, including a polysilicon layer, a metal layer and a protective layer. Abnormal transmission when an electrical signal of the base material is directly transmitted to the metal layer of the word line 130 can be prevented by disposing the polysilicon layer. The signal transmission speed of the word line 130 can be accelerated by disposing the metal layer. The metal layer of the word line 130 can be prevented from being oxidized due to contact with the outside by disposing the protective layer, so that the reduction of the conductivity of the word line 130 due to the oxidization of a part of the metal layer can be avoided.

In some embodiments, a material of the dielectric layer 140 may be an insulation material such as silicon oxide and silicon nitride, so that an abnormal semiconductor structure caused by direct contact between the word lines 130 and the active layers 110 can be avoided.

With reference to FIG. 2, in some embodiments, a first portion of each bit line 120 covers side surfaces of respective active layers 110 of the plurality of active layers 110, and a second portion of each bit line 120 is located in the respective active layers 110. The first portion covers the side surfaces of the active layers 110 and the second portion is located in the active layers 110, so that each bit line 120 may form a consecutive structure. Therefore, the consecutiveness of signal transmission of the bit lines 120 is guaranteed, and the reliability of the semiconductor structure is improved.

In some embodiments, the first portion may include two first conductive structures 121 that are spaced apart from each other and extend in the second direction Y, and the second portion may include a plurality of second conductive structures 122. The plurality of second conductive structures 122 are located in the active layers 110. Each of the plurality of second conductive structures 122 is at least located between the two first conductive structures 121, and each of the plurality of second conductive structures 122 is in contact with and electrically connected to the two first conductive structures 121.

Each bit line 120 may form a consecutive structure by disposing the first conductive structures 121 and the second conductive structures 122 in contact with and electrically connected to the first conductive structures 121. By disposing the first conductive structures 121 on two sidewalls of the active layers 110 spaced apart from each other in the first direction X, the first conductive structures 121 may communicate with the second conductive structures 122 on two sidewalls of the active layers 110 spaced apart from each other in the first direction X. Therefore, the reliability of the conduction of the bit line 120 can be improved.

In some embodiments, the plurality of second conductive structures 122 are connected together in an extending direction of the bit line 120, and extend through the active layers 110. It is to be understood that when an effect of a process for forming the second conductive structures 122, for example, a metal silicide process, is good enough, the second conductive structures 122 may extend through the active layers 110 in the extending direction of the bit line 120, so that the second conductive structures 122 may be formed into a consecutive structure by means of the bit line 120. In this case, the first conductive structures 121 may play a role of improving the conductivity of the bit line 120 and enhancing the reliability of the conduction of the bit line 120.

It is to be noted that it is difficult to form the second conductive structures 122 extending through the active layers 110 in the extending direction of the bit line 120 by means of the metal silicide process. Therefore, the first conductive structures 121 configured to communicate the second conductive structures 122 spaced apart from each other in the second direction are formed, so that the consecutive bit line 120 is formed, thereby enhancing the reliability of the semiconductor structure.

In some embodiments, a material of the second conductive structure 122 may include metal silicide; and a material of the first conductive structure 121 includes conductive metal, such as titanium nitride, tungsten, and molybdenum. The contact resistance between the second conductive structure 122 and the active layer 110 may be reduced by setting the material of the second conductive structure 122 as the metal silicide. A transmission rate of the first conductive structure 121 may be increased by setting the material of the first conductive structure 121 as the metal material.

In some embodiments, a thickness of the first conductive structure 121 in the first direction X ranges from 1 nm to 3 nm. For example, the thickness of the first conductive structure 121 is 1.5 nm or 2 nm. When the thickness of the first conductive structure 121 is less than 1 nm, the resistance of the first conductive structure 121 is relatively large, which may affect the conduction performance of the bit line 120. When the thickness of the first conductive structure 121 is greater than 3 nm, the adjacent bit lines 120 may be connected with each other or the adjacent bit lines 120 may interfere with each other. In some other embodiments, the thickness of the first conductive structure may also be other dimensions, which may be adjusted according to actual requirements.

In some embodiments, a height of an overlapping portion of a projection of the second conductive structure 122 and a projection of the first conductive structure 121 in a plane perpendicular to the substrate 100 is 0.5 to 1 times a height of the projection of the second conductive structure 122 in the plane perpendicular to the substrate 100. It is to be understood that when the height of the overlapping portion of the projection of the second conductive structure 122 and the projection of the first conductive structure 121 is less than 0.5 times the height of the projection of the second conductive structure 122, the interface contact resistance of the first conductive structure 121 and the second conductive structure 122 is relatively high. By setting the height of the overlapping portion of the projection of the second conductive structure 122 and the projection of the first conductive structure 121 to be 0.5 to 1 times the height of the projection of the second conductive structure 122, the interface contact resistance of the first conductive structure 121 and the second conductive structure 122 may be reduced. In some other embodiments, the height of the overlapping portion of the projection of the second conductive structure and the projection of the first conductive structure is 0.5 to 1 times a height of the projection of the first conductive structure.

It is to be understood that the height of the second conductive structure 122 in a direction perpendicular to the substrate 100 is less than or equal to the height of the first conductive structure 121 in the direction perpendicular to the substrate 100. When the projection of the second conductive structure 122 is located in the projection of the first conductive structure 121, the height of the overlapping portion of the projection of the second conductive structure 122 and the projection of the first conductive structure 121 is 1 times the height of the projection of the second conductive structure 122. The height of the second conductive structure 122 in the direction perpendicular to the substrate 100 is greater than or equal to the height of the first conductive structure 121 in the direction perpendicular to the substrate 100. When the projection of the first conductive structure 121 is located in the projection of the second conductive structure 122, the height of the overlapping portion of the projection of the second conductive structure 122 and the projection of the first conductive structure 121 is 1 times the height of the projection of the first conductive structure 121.

In some embodiments, the semiconductor structure further includes: a first isolation layer 170, located on the surface of the substrate 100 and between the active layers 110; a second isolation layer 200, located on a top surface of the first isolation layer 170; a third isolation layer 240, located on top surfaces of the second conductive structures 122, where a top surface of the third isolation layer 240 is lower than a top surface of each of the active layers 110 and higher than a top surface of each of the first conductive structures 121 or flush with the top surface of each of the first conductive structures 121; and a fourth isolation layer 250, where the fourth isolation layer 250 is located on the top surface of the third isolation layer 240, the fourth isolation layer 250 is located between the adjacent word lines 130 and also located on the top surface of each of the active layers 110 and a top surface of each of the word lines 130.

According to the semiconductor structure provided in the embodiments of the disclosure, the first portion of each bit line 120 covers the side surfaces of the active layers 110, the second portion of each bit line 120 is located in the active layers 110, and each bit line 120 may be formed into a consecutive structure in the second direction by means of an electric connection between the first portion and the second portion. In this way, the signal transmission stability of the bit line 120 is enhanced, and the reliability of the semiconductor structure is improved.

Another embodiment of the disclosure further provides a method for manufacturing a semiconductor structure. The method for manufacturing a semiconductor structure is applicable to form the semiconductor structure described above. The method for manufacturing a semiconductor structure provided in another embodiment of the disclosure is described below with reference to the drawings. It is to be noted that for the same or corresponding parts of the foregoing embodiments, refer to corresponding description of the foregoing embodiments, which are not described below again.

Figure 3:
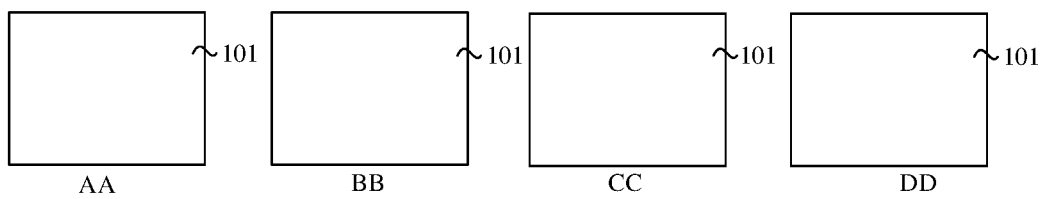
FIG. 3 is a first schematic diagram of structures corresponding to operations of a method for manufacturing a semiconductor structure according to another embodiment of the disclosure.
Figure 4:
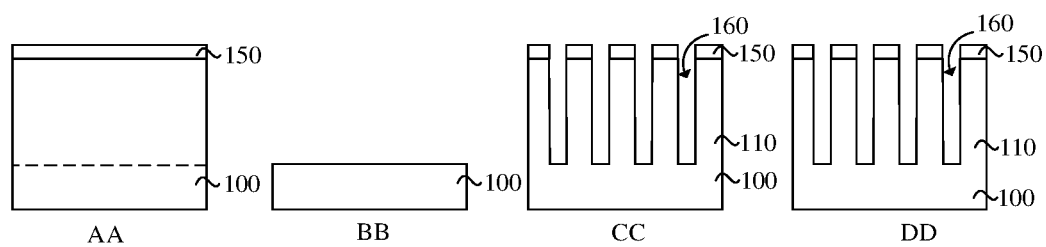
FIG. 4 is a second schematic diagram of structures corresponding to operations of a method for manufacturing a semiconductor structure according to another embodiment of the disclosure.

With reference to FIG. 3 and FIG. 4, a base 101 is provided, and a plurality of active layers 110 spaced apart from each other in a first direction X are formed in the base 101.

It is to be noted that a part of the base 101 located at bottoms of the active layers 110 after the base 101 is patterned may be called a substrate 100.

In some embodiments, the operation that the plurality of active layers 110 may include the following operations. A first mask layer 150 is formed on a surface of the base 101. The first mask layer 150 and the base 101 are etched to form a plurality of first trenches 160 extending in the second direction Y, in which the plurality of first trenches 160 are located between the adjacent active layers 110. That is to say, the plurality of first trenches 160 and the plurality of active layers 110 are formed at the same operation. Part of the base 101 is removed by means of patterning, the retained part of the base 101 forms the plurality of first trenches 160, and part of the base 101 acts as the plurality of active layers 110. A process basis is provided for subsequently forming the first conductive structure by forming the plurality of first trenches 160.

In some embodiments, the plurality of active layers 110 may be formed by means of a Self-aligned Double Patterning (SADP) process. In some other embodiments, the plurality of active layers 110 may also be formed by means of a Self-aligned Quadruple Patterning (SAQP) process. The patterns of the formed active layers 110 may be more accurate by means of the SADP or SAQP technology.

In some embodiments, the first mask layer 150 is retained after the plurality of active layers 110 are formed. The first mask layer 150 is retained to protect top surfaces of the formed active layers 110, so that the top surfaces of the formed active layers 110 may be prevented from being polluted. Therefore, the stability of the semiconductor structure may be enhanced. In some other embodiments, after the plurality of active layers are formed, the method may further include the following operation. The first mask layer is removed.

Figure 5:
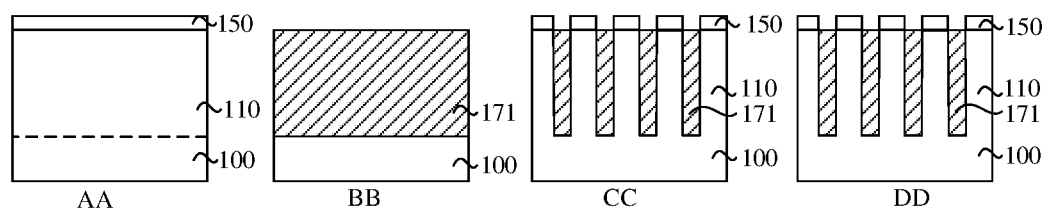
FIG. 5 is a third schematic diagram of structures corresponding to operations of a method for manufacturing a semiconductor structure according to another embodiment of the disclosure.
Figure 6:
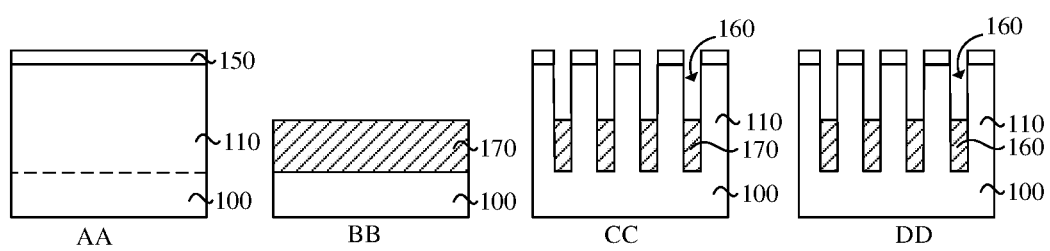
FIG. 6 is a fourth schematic diagram of structures corresponding to operations of a method for manufacturing a semiconductor structure according to another embodiment of the disclosure.

With reference to FIG. 5 and FIG. 6, a first isolation layer 170 is formed. The first isolation layer 170 is located between adjacent active layers 110 of the plurality of active layers 110, and a top surface of the first isolation layer 170 is lower than top surfaces of the plurality of active layers 110.

Specifically, with reference to FIG. 5, the plurality of first trenches 160 are completely filled with an insulation material to form a first initial isolation layer 171. In some embodiments, a top surface of the first initial isolation layer 171 is higher than the top surfaces of the plurality of active layers 110. Part of the first initial isolation layer 171 is removed by means of patterning, to cause the top surface of the first initial isolation layer 171 to be flush with the top surfaces of the plurality of active layers 110. It is to be noted that the expression of flush here may mean that the top surface of the first initial isolation layer 171 is completely flush with the top surfaces of the plurality of active layers 110. Alternatively, a height difference between the top surface of the first initial isolation layer 171 and the top surfaces of the plurality of active layers 110 is within an allowable range, which may be considered that the top surface of the first initial isolation layer 171 is flush with the top surfaces of the plurality of active layers 110.

In some embodiments, the insulation material may be silicon oxide or silicon nitride. By using the insulation material being the silicon oxide as an example, the silicon oxide is soft, which is convenient for filling and etching. The silicon oxide is filled to form the first initial isolation layer 171, which may also be convenient for subsequent patterning of the first initial isolation layer 171.

With reference to FIG. 6, part of the insulation material is removed, to form a first isolation layer 170 in the plurality of first trenches 160. The thickness of the first isolation layer 170 may be controlled by means of a manner of first completely filling the plurality of first trenches 160 and then performing removing, so that the accurate first isolation layer 170 may be formed.

In some embodiments, the first initial isolation layer 171 may be etched in a wet etching manner, to form the first isolation layer 170. The thickness of the first initial isolation layer 171 removed by etching is controlled by controlling a concentration of an etching reagent and etching time.

With reference to FIG. 7 to FIG. 16, a plurality of bit lines 120 spaced apart from each other in the first direction X are formed. The plurality of bit lines 120 extend in the second direction Y. A first portion of each bit line 120 covers side surfaces of the active layers 110, and a second portion of each bit line 120 is located in the active layers 110. The first direction X and the second direction Y are parallel to a surface of the base 101, and the first direction X intersects with the second direction Y. Each bit line 120 of which first portion covers the side surfaces of the active layers 110 and second portion is located in the active layers 110 is formed, so that each bit line 120 may form a consecutive structure. Therefore, the consecutiveness of signal transmission of the bit line 120 is guaranteed, and the reliability of the semiconductor structure is improved.

With reference to FIG. 7 to FIG. 10, a plurality of first conductive structures 121 extending in the second direction Y are formed. The plurality of first conductive structures 121 are located on the side surfaces of the active layers 110 spaced apart from each other in the first direction. The plurality of first conductive structures 121 constitute the first portions of the bit lines 120. The plurality of first conductive structures 121 are formed to provide a basis for subsequently communicating with the second conductive structures to form the consecutive bit lines 120, so that the reliability of the semiconductor structure is improved.

Figure 7:
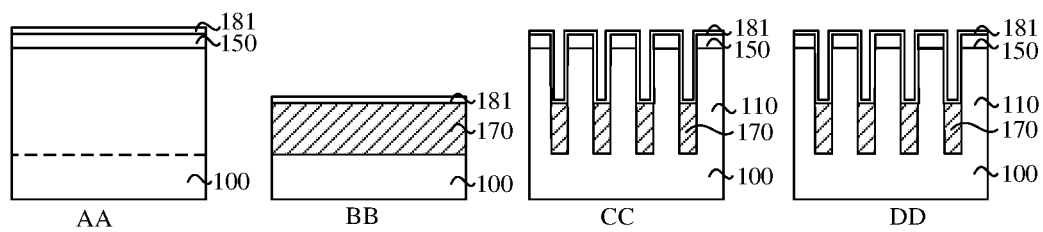
FIG. 7 is a fifth schematic diagram of structures corresponding to operations of a method for manufacturing a semiconductor structure according to another embodiment of the disclosure.

Specifically, with reference to FIG. 7, a second initial mask layer 181 is formed. The second initial mask layer 181 is located above the first isolation layer 170, and covers the sidewalls of the plurality of active layers 110. In some embodiments, the second initial mask layers 181 may be formed on the sidewalls of the plurality of active layers 110, a top surface of the first isolation layer 170, a sidewall of the first mask layer 150 and a top surface of the first mask layer 150 by means of atomic layer deposition. The second initial mask layer 181 may act as a mask layer for subsequently etching the first isolation layer 170. The second initial mask layer 181 formed through atomic layer deposition is relatively even, which is convenient for controlling the thicknesses of the formed second initial mask layer 181.

In some embodiments, a material of the second initial mask layer 181 may be carbon or carbon-containing organics. The carbon or carbon-containing organics are soft in material, fast in etching speed, and accurate as mask pattern, so that the accuracy of the subsequently formed first conductive structures may be enhanced.

Figure 8:
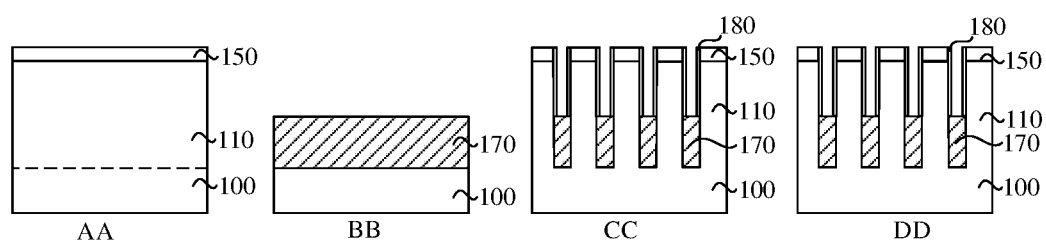
FIG. 8 is a sixth schematic diagram of structures corresponding to operations of a method for manufacturing a semiconductor structure according to another embodiment of the disclosure.

With reference to FIG. 8, the second initial mask layer 181 (with reference to FIG. 7) is patterned. The second initial mask layer 181 (with reference to FIG. 7) located on the top surface of the first mask layer 150 and located on part of the surface of the first isolation layer 170 is removed, to form a plurality of second mask layers 180 spaced apart from each other in the first direction. The plurality of second mask layers 180 are located above the first isolation layer 170, and cover the sidewalls of the plurality of active layers 110. The formed second mask layers 180 may act as masks for subsequently forming the first conductive structures spaced from each other.

Figure 9:
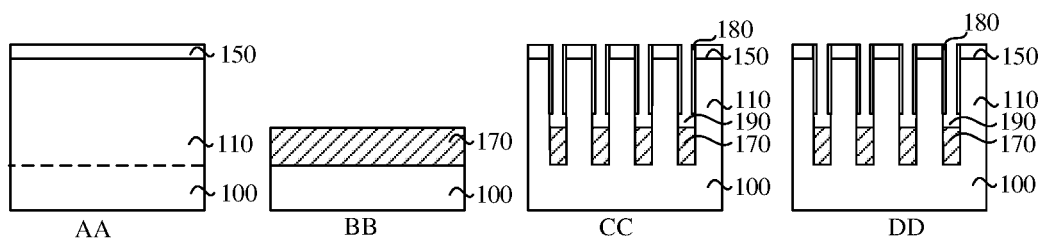
FIG. 9 is a seventh schematic diagram of structures corresponding to operations of a method for manufacturing a semiconductor structure according to another embodiment of the disclosure.

With reference to FIG. 9, part of the first isolation layer 170 and part of a sidewall of each of plurality of the active layers 110 under the second mask layers 180 are removed, to form a plurality of first grooves 190. It is to be noted that during the etching of the first isolation layer 170, the etching reagent is inevitable in contact with the plurality of active layers 110, so that the etching reagent also etches part of each of the plurality of active layers 110. In some other embodiments, only part of the first isolation layer 170 may be etched. The plurality of first grooves 190 are formed to provide a process basis for subsequently forming the first conductive structures. Larger space may be provided for subsequently forming the first conductive structures by etching part of each of the plurality of active layers 110, so that a width of each of the first conductive structures is increased, thereby reducing the resistance of each of the first conductive structures.

Figure 10:
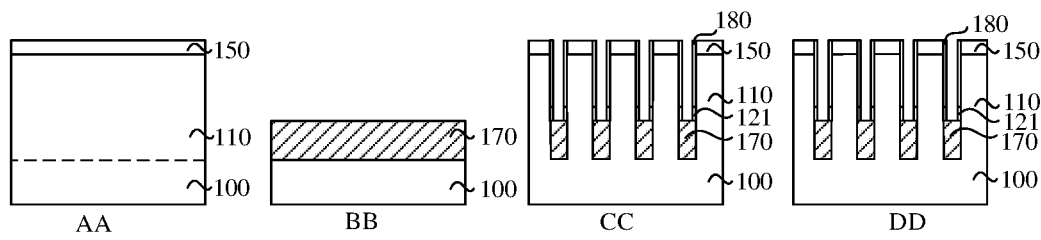
FIG. 10 is an eighth schematic diagram of structures corresponding to operations of a method for manufacturing a semiconductor structure according to another embodiment of the disclosure.

With reference to FIG. 10, a first conductive material is deposited in the plurality of first grooves 190 to form a first initial conductive structure, and the first conductive material is patterned, to form a plurality of first conductive structures 121 spaced apart from each other. In some embodiments, the first plurality of grooves 190 are filled with the first conductive material, and then the first initial conductive structure is patterned by using the plurality of second mask layers 180 as masks, to form a plurality of first conductive structures 121 spaced apart from each other. In some other embodiments, the plurality of first conductive structure 121 may also be formed at the bottom surfaces of the plurality of second mask layers by means of selectivity atomic layer deposition. The plurality of first conductive structure 121 are formed to provide a basis for subsequently forming the bit line consecutive in the first direction.

It is to be understood that the plurality of first conductive structures 121 spaced apart from each other, which are formed by patterning the first initial conductive structure, are the first conductive structures 121 of different bit lines. In other words, the first conductive structures 121 on two sides of the same active layer 110 are the first portion of the same bit line.

With reference to FIG. 11 to FIG. 15, a plurality of second conductive structures 122 are formed. The plurality of second conductive structures 122 are located in plurality of the active layers 110. Each of the plurality of second conductive structures 122 is at least located between two first conductive structures 121 of the plurality of first conductive structures 121, and is in contact with and electrically connected to the two first conductive structures 121. The consecutive bit lines 120 may be formed by forming the plurality of second conductive structures 122 electrically connected to the plurality of first conductive structures 121, so that the bit line 120 forms a consecutive structure. Therefore, the reliability of the semiconductor structure is improved.

Figure 11:
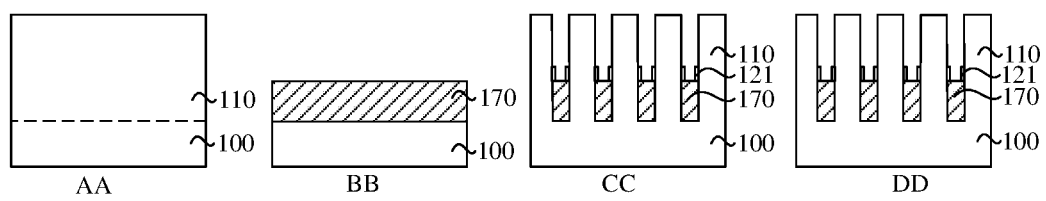
FIG. 11 is a ninth schematic diagram of structures corresponding to operations of a method for manufacturing a semiconductor structure according to another embodiment of the disclosure.

Specifically, with reference to FIG. 11, the first mask layer 150 and the plurality of second mask layers 180 are removed, to expose top surfaces of the plurality of the active layers 110 and a top surface of the first isolation layer 170.

Figure 12:
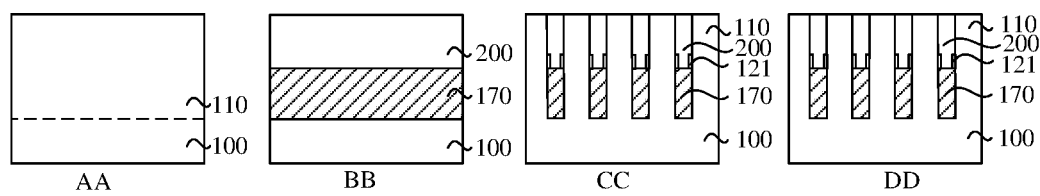
FIG. 12 is a tenth schematic diagram of structures corresponding to operations of a method for manufacturing a semiconductor structure according to another embodiment of the disclosure.

With reference to FIG. 12, a second isolation layer 200 is formed. The second isolation layer 200 is located on the top surface of the first isolation layer 170, and the second isolation layer 200 is located between the plurality of active layers 110. The plurality of first conductive structures 121 may be protected by disposing the second isolation layer 200, and the subsequently formed word lines may also be prevented from being in contact with the plurality of first conductive structures 121.

In some embodiments, the operation that the second isolation layer 200 is formed may include the following operations. A second initial isolation layer is formed, in which the second initial isolation layer also covers the top surfaces of the plurality of active layers 110. The second initial isolation layer is patterned, until the top surfaces of the plurality of active layers 110 are exposed, in which a retained part of the second initial isolation layer serves as the second isolation layer 200.

Figure 13:
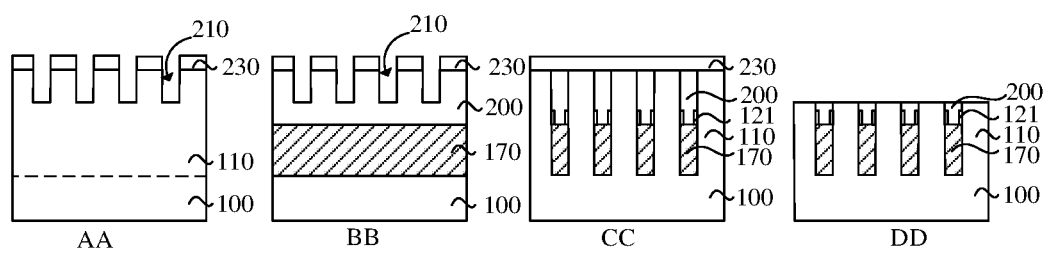
FIG. 13 is an eleventh schematic diagram of structures corresponding to operations of a method for manufacturing a semiconductor structure according to another embodiment of the disclosure.

With reference to FIG. 13, the plurality of active layers 110 are etched, to form a plurality of second trenches 210 extending in the first direction X. Bottom surfaces of the plurality of second trenches 210 are higher than the top surfaces of the plurality of first conductive structures 121. The plurality of second trenches 210 are configured to subsequently form a third mask layer. The plurality of second trenches 210 are formed to provide a process basis for subsequently forming the plurality of second conductive structures.

In some embodiments, the method further includes the following operation. A part of the second isolation layer 200 is etched.

In some embodiments, a fourth mask layer 230 may be formed on the top surfaces of the plurality of active layers 110, and the plurality of active layers 110 are patterned by using the fourth mask layer 230 as a mask, to form the plurality of second trenches 210. The plurality of second trenches 210 with more accurate patterns may be formed by forming the fourth mask layer 230. In some other embodiments, the plurality of second trenches may also be formed in other manners.

In some embodiments, the fourth mask layer 230 is retained after the plurality of second trenches 210 are formed. The fourth mask layer 230 is retained, which may protect the plurality of active layers 110 from being polluted in subsequent process operations. Therefore, the reliability of the semiconductor structure may be improved.

In some embodiments, the fourth mask layer 230 and the first mask layer 150 may be made of a same material, which may both be materials such as silicon nitride.

Figure 14:
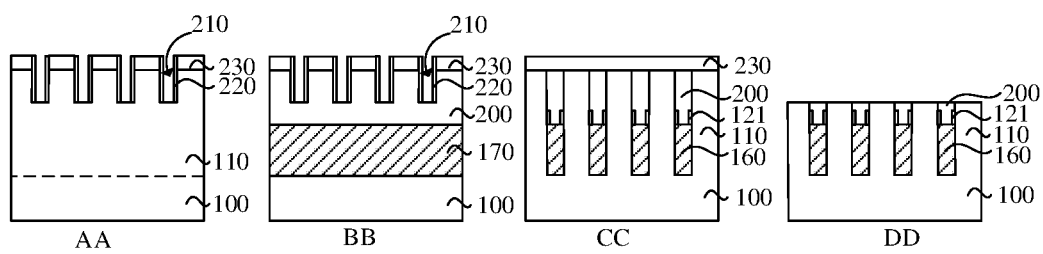
FIG. 14 is a twelfth schematic diagram of structures corresponding to operations of a method for manufacturing a semiconductor structure according to another embodiment of the disclosure.

With reference to FIG. 14, a plurality of third mask layers 220 are formed in the plurality of second trenches 210. The plurality of third mask layers 220 cover sidewalls of the plurality of second trenches 210. By forming the plurality of third mask layers 220, the plurality of active layers 110 may be protected when the plurality of second conductive structures are formed by a subsequent metal silicide process, which may prevent inner walls of the plurality of second trenches 210 from being polluted. The reliability of the semiconductor structure is improved by forming the plurality of third mask layers 220.

In some embodiments, the operation that the plurality of third mask layers 220 are formed may include the following operations. A third initial mask layer is formed, in which the third initial mask layer also covers a top surface of the fourth mask layer 230 and the surfaces of the plurality of active layers 110. The third initial mask layer is patterned to form the plurality of third mask layers 220 spaced apart from each other. During the patterning of the third initial mask layer, the fourth mask layer 230 may be used as an etching-stop layer for the third initial mask layer. The fourth mask layer 230 may avoid the direct contact between the etching reagent and the top surfaces of the plurality of active layers 110. Therefore, the top surfaces of the plurality of active layers 110 may be prevented from being polluted, and the reliability of the semiconductor structure may be improved.

In some embodiments, the material of the third mask layer 220 may be the same as the material of the second mask layer 180, which may be carbon or carbon-containing organics.

Figure 15:
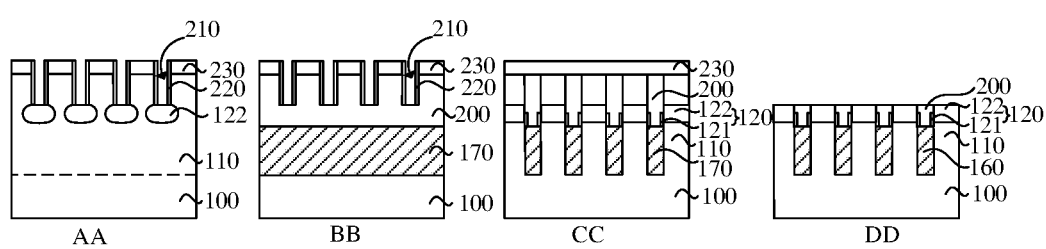
FIG. 15 is a thirteenth schematic diagram of structures corresponding to operations of a method for manufacturing a semiconductor structure according to another embodiment of the disclosure.

With reference to FIG. 15, a second conductive material is deposited at bottoms of the plurality of second trenches 210, and rapid thermal process is performed on the second conductive material to form the plurality of second conductive structures 122. In some embodiments, the second conductive material includes a metal material. During the rapid thermal process, the metal material is dispersed into the plurality of active layers 110 to form metal silicide. The metal silicide is at least located between two first conductive structures 121, to form the plurality of second conductive structures 122. That is, the plurality of second conductive structures 122 are formed by using the metal silicide process, which reduce the resistance of the plurality of second conductive structures 122, so that the performance of the semiconductor structure is improved. After the second conductive structures 122 are formed, the method further includes the following operation. The second conductive material is removed to expose the top surfaces of the plurality of second conductive structures 122.

In some embodiments, the rapid thermal process may be Rapid Thermal Annealing (RTA). In some embodiments, RTA processes may be performed for two times. A short circuit caused by excessive growth of the plurality of second conductive structures 122 may be prevented by performing the rapid thermal process for two times.

Specifically, the operation that the plurality of second conductive structures 122 are formed may include the following operations. A second conductive material is deposited at bottoms of the plurality of second trenches 210. By using the second conductive material being titanium and the material of the active layers being single-crystal silicon as an example, a titanium nitride film is deposited on the surface of the titanium after the second conductive material is deposited, and the titanium nitride film may prevent the titanium from flowing during RTA. A first RTA is performed, where the titanium reacts with the single-crystal silicon of the plurality of active layers 110 to generate high-resistance metal silicide. The titanium and the titanium nitride film may be removed by means of selectivity wet etching. A second RTA is performed. The high-resistance metal silicide may be converted into low-resistance metal silicide by means of the second RTA. The low-resistance metal silicide is the second conductive structure. It is to be understood that the above titanium nitride film, titanium and single-crystal silicon materials are only examples for ease of description, and do not limit the second conductive material, the film on the second conductive material, and the material of the plurality of active layers 110, which may be adjusted according to the actual requirements.

In some embodiments, a temperature for the rapid thermal process may range from 400° C. to 800° C. When the temperature for the rapid thermal process is less than 400° C., a speed by which the second conductive structures 122 are formed is relatively slow during the formation of the second conductive structures 122, and the formed second conductive structures 122 are poor in appearance. When the temperature of the rapid thermal process is greater than 800° C., the first conductive structures 121 may be affected during the formation of the second conductive structures 122, and abnormal first conductive structures 121 may be formed. Therefore, by setting the temperature of the rapid thermal process to range from 400° C. to 800° C., impact on other structures of the semiconductor structure may be avoided while the speed and appearance for forming the second conductive structures 122 are guaranteed.

In some embodiments, the rapid thermal process is performed for two times, the temperature for the last rapid thermal process may be higher than the temperature for the previous rapid thermal process.

In some embodiments, the plurality of second conductive structures 122 located between the two first conductive structures 121 are connected to each other, and extend through the active layers 110 in the second direction Y. The formed bit line 120 may form a consecutive structure by forming the plurality of second conductive structures 122 connected to each other, so that the signal transmission stability of the bit lines 120 may be enhanced, and the reliability of the semiconductor structure may be improved.

It is to be noted that, by means of the metal silicide process, it is difficult to form a consecutive structure in the plurality of active layers 110 after metal ions are diffused. Therefore, by a manner of first forming the plurality of first conductive structures 121 and then performing the metal silicide process, the bit line 120 may form a consecutive structure by means of the mutual connection of the plurality of first conductive structures 121 and the plurality of second conductive structures 122 even if the consecutive structure is not formed in the plurality of active layers 110 by means of the metal silicide process. Therefore, the signal transmission stability of the bit lines 120 may be guaranteed, and the reliability of the semiconductor structure may be improved.

Figure 16:
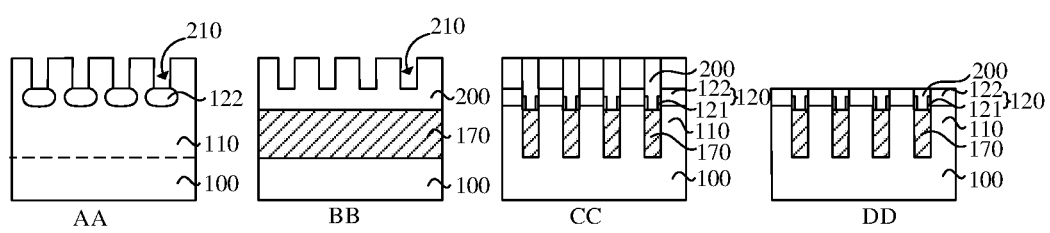
FIG. 16 is a fourteenth schematic diagram of structures corresponding to operations of a method for manufacturing a semiconductor structure according to another embodiment of the disclosure.

With reference to FIG. 16, the plurality of third mask layers 220 and the fourth mask layer 230 are removed, to expose the top surfaces of the plurality of active layers 110 and the top surfaces of the plurality of second conductive structures 122.

Figure 17:
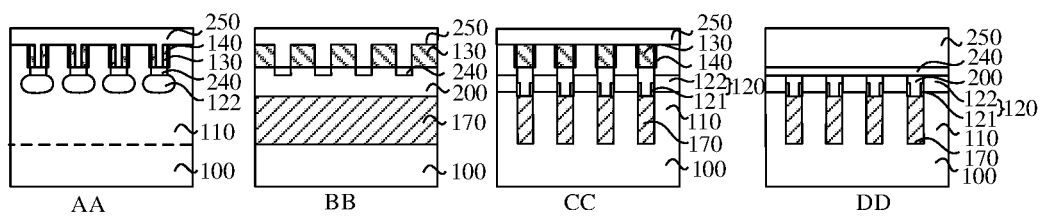
FIG. 17 is a fifteenth schematic diagram of structures corresponding to operations of a method for manufacturing a semiconductor structure according to another embodiment of the disclosure.

With reference to FIG. 17, a plurality of word lines 130 are formed. In some embodiments, the operation that the plurality of word lines 130 are formed may include the following operations. A plurality of third isolation layers 240 are formed in the plurality of second trenches 210. Top surfaces of the plurality of third isolation layers 240 are lower than the top surfaces of the plurality of active layers 110, and are higher than the top surfaces of the plurality of first conductive structures or flush with the top surfaces of the plurality of first conductive structures 121. A plurality of dielectric layers 140 are formed. The dielectric layers 140 are located on the sidewalls of the plurality of active layers 110. The plurality of word lines 130 are formed, in which the plurality of word lines 130 are located on sidewalls of the plurality of dielectric layers 140. The adjacent word lines 130 are spaced apart from each other in the second direction Y. A fourth isolation layer 250 is formed, in which the plurality of second trenches 210 are completely filled with the fourth isolation layer 250, and the fourth isolation layer also covers top surfaces of the plurality of word lines 130 and the top surfaces of the plurality of active layers 110.

In some embodiments, the operation that the third isolation layer 240 is formed may include the following operations. A third initial isolation layer is formed. A top surface of the third initial isolation layer is flush with the top surfaces of the plurality of active layers 110. The third initial isolation layer is patterned, in which a retained part of the third initial isolation layer serves as the third isolation layer 240. A height of the formed third isolation layer 240 in the direction perpendicular to the substrate 100 may be controlled by controlling the concentration and etching time of the etching reagent for etching the third initial isolation layer. The plurality of word lines 130 may be prevented from being in contact with the plurality of first conductive structures 121 by forming the third isolation layer 240, so that an abnormal semiconductor structure can be avoided, and the reliability of the semiconductor structure may be improved.

In some embodiments, the operation that the plurality of dielectric layers 140 are formed may include the following operations. The plurality of dielectric layers 140 are formed by means of thermal oxidation. The plurality of dielectric layers 140 formed by means of thermal oxidation has a high density, so that the performance of the formed dielectric layers 140 is desirable. In some other embodiments, the plurality of dielectric layers 140 may also be formed by means of deposition first and then mask etching. The method of deposition first and then mask etching may well control a width of the formed dielectric layers 140. The abnormal semiconductor structure caused by direct contact between the plurality of active layers 110 and the plurality of word lines 130 is avoided by forming the plurality of dielectric layers 140. Therefore, the reliability of the semiconductor structure may be improved.

In some embodiments, the operation that the fourth isolation layer 250 is formed may include the following operation. An insulation material is deposited on the entire surface of the semiconductor structure, and then uneven portions of the surface of the semiconductor structure are removed by means of chemical mechanical polishing, to form the fourth isolation layer 250. In some embodiments, the third isolation layer 240 and the fourth isolation layer 250 may have a same material as the first isolation layer 170, which may both be silicon oxide or silicon nitride materials. The adjacent word lines 130 may be spaced apart from each other by forming the fourth isolation layer 250, so that signal interference between the adjacent word lines 130 is avoided. The fourth isolation layer may also be used as protective layer of the plurality of word lines 130, so that the plurality of word lines 130 are prevented from being in direct contact with the outside.

In the embodiments of the disclosure, during the formation of the bit lines 120, the plurality of first conductive structures 121 are first formed, and then the plurality of second conductive structures 122 are formed, so that the bit line 120 may form a consecutive structure through the electric connection between the first conductive structures 121 and the second conductive structures 122, even if the second conductive structures 122 does not form a consecutive structure. Therefore, the signal transmission stability of the bit lines 120 may be enhanced, and the reliability of the semiconductor structure may be improved.

Those of ordinary skill in the art may understand that the above implementations are specific examples for realizing the disclosure, and in practical application, various changes may be made in form and details without departing from the spirit and the scope of the embodiments of the disclosure. Any person skilled in the art may make respective changes and modifications without departing from the spirit and scope of the embodiments of the disclosure. Therefore, the protection scope of the embodiments of the disclosure should be subject to the scope defined by the claims.

What is claimed is:

1. A semiconductor structure, comprising:
   a substrate;
   a plurality of active layers, wherein the plurality of active layers are arranged on the substrate and spaced apart from each other; and
   a plurality of bit lines, wherein the plurality of bit lines are spaced apart from each other in a first direction and extend in a second direction, wherein a first portion of each of the plurality of bit lines covers side surfaces of respective active layers of the plurality of active layers, and a second portion of each of the plurality of bit lines is located in the respective active layers; and wherein the first direction and the second direction are parallel to a surface of the substrate, and the first direction intersects with the second direction.

2. The semiconductor structure of claim 1, wherein the first portion comprises two first conductive structures that are spaced apart from each other and extend in the second direction, the second portion comprises a plurality of second conductive structures, and the plurality of second conductive structures are located in the respective active layers, wherein each of the plurality of second conductive structures is at least located between the two first conductive structures, and each of the plurality of second conductive structures is in contact with and electrically connected to the two first conductive structures.

3. The semiconductor structure of claim 2, wherein the plurality of second conductive structures are connected together in an extending direction of each of the plurality of bit lines, and extend through the respective active layers.

4. The semiconductor structure of claim 3, wherein a material of the plurality of second conductive structures comprises metal silicide, and a material of the two first conductive structures comprises conductive metal.

5. The semiconductor structure of claim 2, wherein a material of the plurality of second conductive structures comprises metal silicide, and a material of the two first conductive structures comprises conductive metal.

6. The semiconductor structure of claim 2, wherein a thickness of each of the two first conductive structures in the first direction ranges from 1 nm to 3 nm.

7. The semiconductor structure of claim 2, wherein a height of an overlapping portion of a projection of each of the plurality of second conductive structures and a projection of each of the two first conductive structures in a plane perpendicular to the substrate is 0.5 to 1 times a height of the projection of each of the plurality of second conductive structures in the plane perpendicular to the substrate.

8. A method for manufacturing the semiconductor structure of claim 1, the method comprising:
   providing the base, and forming the plurality of active layers spaced apart from each other in the first direction in the base; and
   forming the plurality of bit lines spaced apart from each other in the first direction.

9. The method for manufacturing the semiconductor structure of claim 8, wherein forming the plurality of bit lines comprises:
   forming a plurality of first conductive structures extending in the second direction, wherein the plurality of first conductive structures are located on the side surfaces of the plurality of active layers spaced apart from each other in the first direction; and
   forming a plurality of second conductive structures, wherein the plurality of second conductive structures are located in the plurality of active layers, and each the plurality of second conductive structures is at least located between two first conductive structures of the plurality of first conductive structures, and is in contact with and electrically connected to the two first conductive structures.

10. The method for manufacturing the semiconductor structure of claim 9, wherein forming the plurality of first conductive structures comprises:
   providing the base;

patterning the base, to form the plurality of active layers spaced apart from each other in the first direction;

forming a first isolation layer, wherein the first isolation layer is located between adjacent active layers of the plurality of active layers, and a top surface of the first isolation layer is lower than a top surface of each of the plurality of active layers; and forming the plurality of first conductive structures above the first isolation layer.

11. The method for manufacturing the semiconductor structure of claim 10, wherein forming the first isolation layer comprises: forming a first mask layer on a surface of the base, and etching the first mask layer and the base to form a plurality of first trenches extending in the second direction, wherein the first trenches are located between the adjacent active layers; and completely filling the plurality of first trenches with an insulation material, and removing part of the insulation material, to form the first isolation layer in the plurality of first trenches.

12. The method for manufacturing the semiconductor structure of claim 11, wherein forming the plurality of first conductive structures above the first isolation layer comprises:

forming a second mask layer, wherein the second mask layer is located above the first isolation layer and covers a sidewall of each of the plurality of active layers;

removing part of the first isolation layer and part of the sidewall of each of the plurality of active layers under the second mask layer, to form a first groove; and depositing a first conductive material in the first groove, and patterning the first conductive material, to form the plurality of first conductive structures spaced apart from each other.

13. The method for manufacturing the semiconductor structure of claim 12, wherein forming the plurality of second conductive structures comprises:

etching the plurality of active layers to form a plurality of second trenches extending in the first direction, wherein bottom surfaces of the plurality of second trenches are higher than top surfaces of the plurality of first conductive structures;

forming a plurality of third mask layers in the plurality of second trenches, wherein the plurality of third mask layers cover sidewalls of the plurality of second trenches; and depositing a second conductive material at bottoms of the plurality of second trenches, and performing rapid thermal process on the second conductive material to form the plurality of second conductive structures.

14. The method for manufacturing the semiconductor structure of claim 13, wherein a temperature for the rapid thermal process ranges from 400° C. to 800° C.

15. The method for manufacturing the semiconductor structure of claim 12, wherein the second conductive material comprises a metal material, wherein during the rapid thermal process, the metal material is dispersed into the plurality of active layers to form metal silicide, and the metal silicide is at least located between the two first conductive structures, to form the plurality of second conductive structures.

16. The method for manufacturing the semiconductor structure of claim 9, wherein the plurality of second conductive structures located between the two first conductive structures are connected to each other, and extend through the plurality of active layers in the second direction.

* * * * *